(12) United States Patent
Cantor et al.

(10) Patent No.: US 7,247,603 B2
(45) Date of Patent: Jul. 24, 2007

(54) CHARGE DISSIPATIVE DIELECTRIC FOR CRYOGENIC DEVICES

(75) Inventors: Robin Harold Cantor, Santa Fe, NM (US); John Addison Hall, Albuquerque, NM (US)

(73) Assignee: Star Cryoelectronics, Santa Fe, NM (US)

( * ) Notice: Subject to any disclaimer, the term of this patent is extended or adjusted under 35 U.S.C. 154(b) by 0 days.

(21) Appl. No.: 10/970,539

(22) Filed: Oct. 20, 2004

(65) Prior Publication Data

US 2005/0107261 A1    May 19, 2005

Related U.S. Application Data

(60) Provisional application No. 60/513,747, filed on Oct. 23, 2003.

(51) Int. Cl.
*H01L 39/10* (2006.01)
*H01L 29/12* (2006.01)
*H01B 1/00* (2006.01)

(52) U.S. Cl. .................. 505/701; 505/162; 505/190; 505/191; 505/235; 505/238; 62/259.2; 136/239; 327/366; 327/367; 361/19; 257/61; 428/689; 428/930

(58) Field of Classification Search .............. 252/500, 252/514, 518.1; 505/238, 701; 257/412; 428/689, 702, 930
See application file for complete search history.

(56) References Cited

U.S. PATENT DOCUMENTS

| | | | | |
|---|---|---|---|---|
| 3,359,466 A | * | 12/1967 | Morris et al. | ............ 29/25.02 |
| 5,026,682 A | * | 6/1991 | Clark et al. | ............ 505/162 |
| 5,098,884 A | * | 3/1992 | Yamazaki | ............ 505/471 |
| 5,241,828 A | * | 9/1993 | Kapitulnik | ............ 62/3.2 |
| 5,721,197 A | * | 2/1998 | Downar et al. | ............ 505/238 |
| 6,365,913 B1 | * | 4/2002 | Misewich et al. | ............ 257/43 |
| 6,794,682 B2 | * | 9/2004 | Watanabe et al. | ............ 257/72 |

OTHER PUBLICATIONS

SQUID Magnetometer- http://hyperphysics.phy-astr.gsu.edu/hbase/solids/squid.html.
International Search Report, PCT/US04/34899, mailed Nov. 22, 2006.
Written Opinion of the International Searching Authority, application serial No. PCT/US04/34899, mailed Nov. 22, 2006.

* cited by examiner

*Primary Examiner*—Douglas McGinty
*Assistant Examiner*—Kallambella Vijayakumar
(74) *Attorney, Agent, or Firm*—Duane Morris, LLP

(57) ABSTRACT

A Superconducting Quantum Interference Device (SQUID) is disclosed comprising a pair of resistively shunted Josephson junctions connected in parallel within a superconducting loop and biased by an external direct current (dc) source. The SQUID comprises a semiconductor substrate and at least one superconducting layer. The metal layer(s) are separated by or covered with a semiconductor material layer having the properties of a conductor at room temperature and the properties of an insulator at operating temperatures (generally less than 100 Kelvins). The properties of the semiconductor material layer greatly reduces the risk of electrostatic discharge that can damage the device during normal handling of the device at room temperature, while still providing the insulating properties desired to allow normal functioning of the device at its operating temperature. A method of manufacturing the SQUID device is also disclosed.

18 Claims, 5 Drawing Sheets

CHARGE DISSIPATIVE DIELECTRIC FOR CRYOGENIC DEVICES

CROSS-REFERENCE TO RELATED APPLICATION

This is a non-provisional patent application of currently pending U.S. provisional patent application Ser. No. 60/513,747, filed Oct. 23, 2003, by Cantor et al., titled "Charge Dissipative Dielectric for Cryogenic Devices," the entirety of which application is incorporated herein by reference.

GOVERNMENT LICENSE RIGHTS

The U.S. Government has a paid-up license in this invention and the right in limited circumstances to require the patent owner to license others on reasonable terms as provided for by the terms of Contracts NAS5-00236 and NAS5-00237, awarded by NASA.

FIELD OF THE INVENTION

This invention relates to Superconducting Quantum Interference Devices (SQUIDs) in general and more particularly to a process for the fabrication of thin film cryogenic devices which include a semiconductor layer that is conductive at room temperature and prevents electrostatic charge accumulation which can damage the device, but which is insulating at the operating temperature of the device.

BACKGROUND OF THE INVENTION

Thin film devices typically comprise a multiplicity of metal wiring layers separated by insulating, or dielectric, material layers to provide electrical isolation. If the dielectric used to electrically isolate the wiring layers of a thin film circuit is a perfect insulator, normal handling of the chips cut from fabricated wafers can lead to the accumulation of electrostatic charge and the formation of very large potential differences between the thin-film layers of the device. An electrostatic discharge (ESD) occurs if the potential difference becomes too large, which can damage or destroy the circuit. In order to minimize device failure owing to electrostatic discharge, special ESD-safe workstations and tools are required, and all personnel handling the circuits must wear grounded wrist straps and heel straps. Anti-static lotions and smocks also are commonly used when handling sensitive circuits.

Thus, it would be desirable to provide a device which minimizes the potential difference between adjacent metal wiring layers during normal handling, but which also provides the desired isolation between such layers during operation, when such isolation is functionally required. Specifically, for superconducting devices it would be desirable to provide a transition layer which provides conductance between adjacent metal layers during handling at room temperature, when the potential for ESD is greatest, but which acts as an insulator between the metal layers during operation, at temperatures below about 100 Kelvins (K).

Devices incorporating layers of material capable of undergoing an insulator to metal transition are known. For example, in U.S. Pat. No. 6,365,913 to Misewich et al., a Field effect transistor semiconductor switch is disclosed in which the channel is made from materials having an electrical conductivity which can undergo an insulator-metal transition (i.e., Mott transition) upon application of an electric field. Likewise, U.S. Pat. No. 5,721,197 to Downar et al. discloses a microelectronic thin-film device having a thin superconducting layer in contact with a thin quasi-insulating conversion layer. The critical current of the superconducting layer is controlled by application of a voltage to the conversion layer by means of a gate electrode, causing the conversion layer to undergo an insulator-metal transition. Both references require the application of a voltage or electric field in order to change the conductivity of the transition material.

Thus, there remains a need for a device that allows for conductance between metal layers during normal handling at room temperatures, thus minimizing the potential for destructive ESD, but which provides the desired electrical isolation between metal layers during normal operation at the low operating temperatures associated with superconducting devices.

SUMMARY OF THE INVENTION

This invention discloses a whole-wafer process for the fabrication of SQUID circuits which includes a semiconductor layer that is conductive at room temperature and prevents electrostatic charge accumulation, but which is insulating at the operating temperature of the SQUID (typically well below 100 K).

The superconducting metal wiring layers used to fabricate the SQUID circuits are separated by a conductive doped semiconductor film that prevents charge accumulation at room temperature, thereby greatly reducing the risk of electrostatic discharge that may damage the SQUID circuits during normal handling at room temperature. When the SQUID is cooled to its normal operating temperature, the semiconductor film undergoes a metal-insulator transition (MIT) and becomes an insulating dielectric. The semiconductor film may therefore be used in place of or in conjunction with conventional dielectric films typically used to fabricate integrated circuit devices for cryogenic applications. Alternatively, the semiconductor film may be deposited as the final passivation layer on top of the completed SQUID circuit, or as the first film of a multiple film passivation layer.

The metal-insulator transition (also referred to as the metal-nonmetal transition) is characterized by a sudden change in the electrical conductivity due to a reversible change from localized to itinerant behavior of the electrons. In order for the room-temperature semiconductor film to become an insulating dielectric at cryogenic temperatures, the doping level of the semiconductor must be below the MIT critical concentration $N_c$, above which the doped semiconductor film remains metallic even as the temperature T approaches 0 K. When using crystalline silicon, for example, $N_c \sim 3.5 \times 10^{18}/cm^3$, with only a weak dependence on the specific dopant used. For other forms of doped silicon films, for example amorphous, polycrystalline, or compensated silicon films, $N_c$ can be much higher. The controlled deposition of doped semiconductor films with a doping level below the critical threshold is straightforward. In addition to doped semiconductors, amorphous metal-semiconductor mixtures also undergo metal-insulator phase transitions, depending on the concentration of the constituent metal. Such amorphous metal-semiconductor films provide an alternative to the use of doped semiconductor films in the disclosed process.

A thin film device is disclosed comprising a substrate, a conductive material layer overlying the substrate, and a layer of metal-insulator transition material overlying the conductive material layer. The transition material layer acts as a conductor between features, structures or circuit elements patterned in the conductive material layer when the device is at a first temperature. The transition material layer further acts as an insulator between the features, structures or circuit elements patterned in the conductive material layer when the device is at its operating temperature.

A method of forming a thin film device is also disclosed comprising: providing a substrate; depositing a first conductive material layer on at least a portion of the substrate; and depositing a metal-insulator transition material layer over at least a portion of the first conductive material layer. The metal-insulator transition material acts as a conductor when the device is at a first temperature. The metal-insulator transition material layer further acts as an insulator when the device is at a second temperature.

A superconducting device is disclosed comprising a substrate, a first superconducting wiring layer, and a metal-insulator transition material layer overlying at least a portion of said first superconducting wiring layer. The metal-insulator transition material layer acts as a conductor when the device is at a first temperature and acts as an insulator when the device is at its operating temperature.

DETAILED DESCRIPTION OF THE INVENTION

Figure 1:
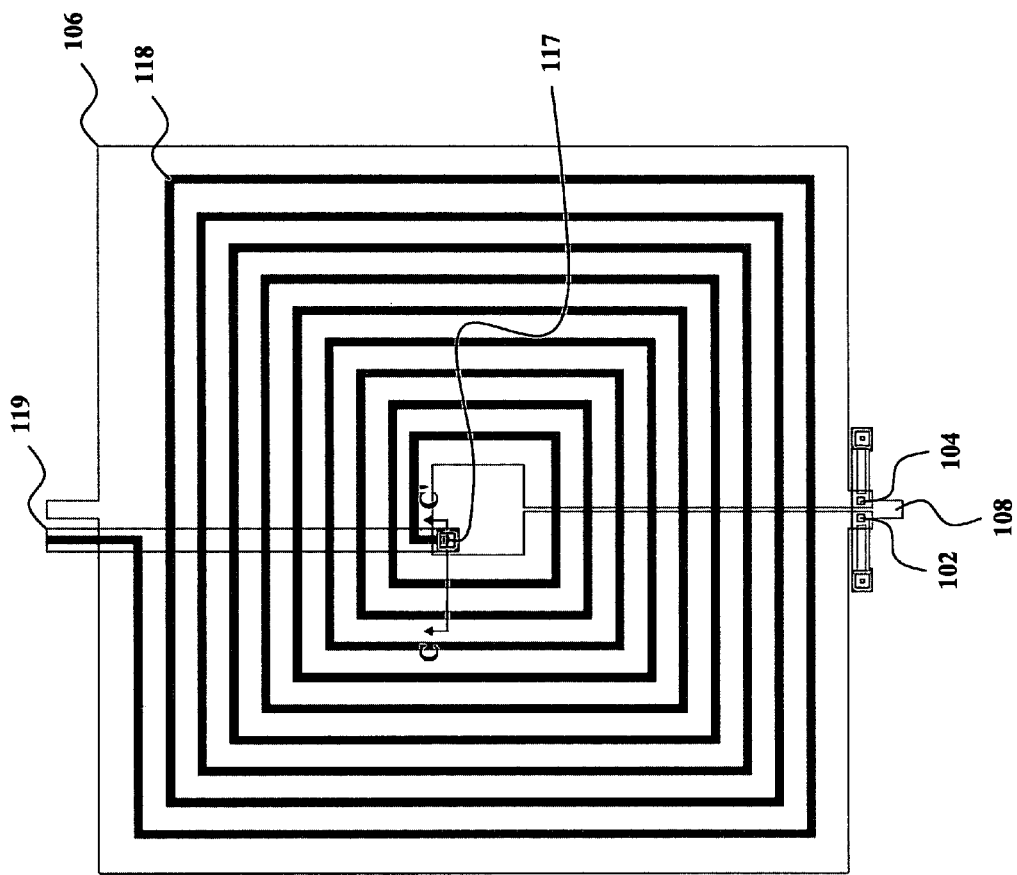
FIG. 1 is a plan view of an integrated SQUID layout.

Throughout the following description, specific process details are set forth in order to provide a more thorough understanding of the invention. However, the invention may be practiced without these particulars. Accordingly, the specifications and drawings are to be regarded in an illustrative, rather than a restrictive, sense.

A direct current (dc) SQUID consists of two resistively-shunted Josephson junctions which are connected in parallel within a superconducting loop and biased by an external dc source. The SQUID may be current biased or voltage biased depending on the type of readout electronics used. Dc SQUIDs are typically multilayer thin-film devices, incorporating polycrystalline films of niobium for the Josephson junction electrodes. The element niobium is a borderline Type II superconductor with a relatively high critical temperature $T_c$=9.2 K and energy gap $\Delta \approx 1.5$ millivolts (mV) which provide a reasonable temperature margin for junction operation at liquid helium temperatures. High-quality thin films of niobium can be fabricated using electron-beam or ion-beam evaporation or dc sputtering techniques. The latter is more common for Josephson junction fabrication.

Although niobium films can easily be oxidized to form the thin, insulating tunnel barrier required for Josephson junction fabrication, the oxide formed on niobium includes not only the stable pentoxide $Nb_2O_5$, but also the sub-oxides of niobium $NbO_2$ and NbO, the latter of which is a superconductor. The presence of these sub-oxides degrades the performance of Josephson junctions fabricated using oxidized niobium barriers. A very thin film (a few monolayers) of aluminum will "wet" and completely cover the surface of a clean niobium film. Thus, high-quality junctions can be fabricated on niobium thin-film electrodes by first depositing a very thin aluminum film 2 nanometers (nm) to 4 nm thick onto the niobium surface and then oxidizing the aluminum film. The junction is completed with the deposition of the top niobium electrode.

Whole-wafer processes can be applied for the fabrication of Josephson junctions. With these processes, Josephson junction devices with reproducible parameters and narrow parameter spreads can be fabricated on entire silicon wafers. These processes start with the deposition of a superconductor-barrier-superconductor trilayer on a silicon wafer in a single deposition sequence without breaking vacuum. For niobium tunnel junctions fabricated with oxidized aluminum barriers, these trilayers are usually denoted as $Nb/Al—AlO_x/Nb$ structures. Individual Josephson junctions are then defined using a photoresist stencil and the exposed top superconductor film is either completely anodized down to the barrier layer, or the exposed top superconductor film is removed down to the barrier layer using a reactive ion etch (RIE) process, and the exposed areas are then lightly anodized. The Josephson junctions are then completed by depositing and patterning a superconducting wiring layer with or without an intermediate insulating layer. More complex structures may require the deposition of a second insulator layer and second superconducting wiring layer.

The insulating layers used to separate the superconducting wiring layers typically are oxides with low dielectric constants. Commonly used dielectrics include SiO, $SiO_2$ and $Si_3N_4$, but other dielectrics including films of polycrystalline silicon have been used as well. For most wafer-scale SQUID processes, however, thin films of $SiO_2$ are preferred owing to the low dielectric constant of $SiO_2$. High-quality $SiO_2$ films may be RF sputter deposited using a quartz target, reactively sputtered using a silicon target and $Ar—O_2$ plasma, or, more commonly, using Plasma-Enhanced Chemical Vapor Deposition (PECVD) via the chemical decomposition of silane.

Wafer-scale processes are important for cost-effective production of SQUIDs and large-area integrated SQUID sensors, such as thin-film SQUID magnetometers and planar SQUID gradiometers.

A process suitable for the fabrication of SQUIDs and integrated SQUID sensors consists of six mask levels. To begin, a $Nb/Al—AlO_x/Nb$ trilayer is deposited over an entire oxidized silicon wafer in a single vacuum sequence. Then, the trilayer is patterned using a wet or dry etch process to define the base electrode, contact pads, and interconnects. The Josephson junctions are defined next using a photoresist stencil, and the top niobium layer is anodized slightly past the bottom Nb/Al interface. A niobium wiring layer is deposited and patterned using a photoresist stencil and reactive ion etch process to define the SQUID washer, Josephson junction top electrode, and interconnects. The Josephson junction shunt resistors are deposited next and patterned using a photoresist stencil and either a lift-off process or dry etch, such as an argon ion mill process. Next, an insulating dielectric layer, typically $SiO_2$, is deposited over the entire wafer, and contact vias are opened to the first wiring layer or to the base electrode of the trilayer using a photoresist stencil and a wet etch or RIE process. To complete the SQUIDs, the top niobium wiring layer is deposited and patterned using a photoresist stencil and lift-off process or RIE process to define the input and feedback coils and remaining interconnects. In many cases, it is desirable to deposit a final dielectric layer to passivate and protect the SQUID circuit from moisture or mechanical abrasion. Typically, $SiO_2$ or $Si_3N_4$ films are used for this purpose.

The following is a description of the invention as used to fabricate integrated SQUIDs intended for operation at about 4K, although SQUIDs having operating temperatures of greater or less than 4K can be fabricated using the principles of the invention. Additionally, it will be appreciated that although the invention will be described in relation to constructing Josephson junctions having a "stack" arrangement, it is equally applicable to "weak link" type junctions, in which a narrow constriction is formed in a conductive material wire to provide the same type of functionality as the "stack" type junction. Similarly, the invention could be applied to a "step-edge" junction, in which the metal film layer is formed over a step-like feature in the substrate to form a similar weak link in the wire.

The integrated SQUID layout depicted in FIG. 1 as a plan view comprises two Josephson junctions 102, 104 connected within a superconducting loop by the washer-shaped SQUID inductance 106 and base electrode 108, along with two shunt resistors 110, 112 between the top electrode of the Josephson junctions 102, 104 and two contact vias 114, 116 to the base electrode 108. An input coil 118 is integrated on top of the SQUID washer 106. A contact via 117 is used to connect the input coil 118 to a stripline 119 that is electrically isolated from and located underneath the SQUID washer 106 which is used as the current return path for the input coil 118.

Figure 2:
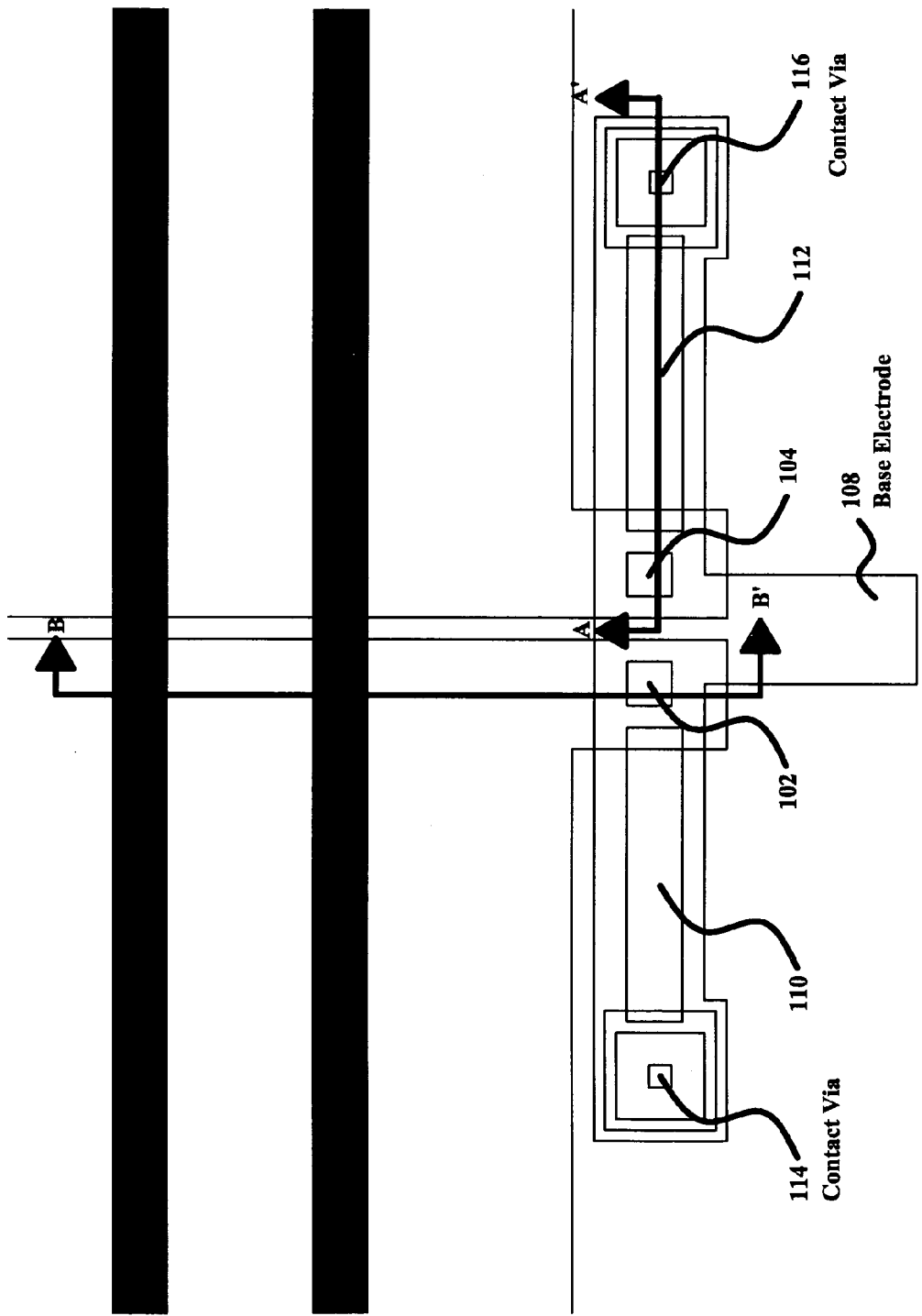
FIG. 2 is plan view of the Josephson junction area of the SQUID layout of FIG. 1.
Figure 3A:
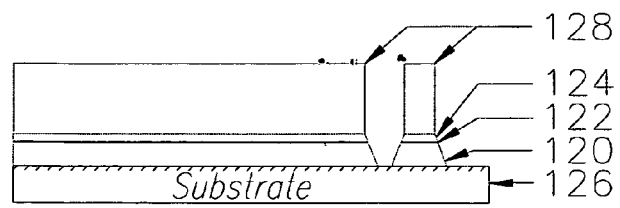
FIGS. 3A-E are cross-sectional views taken along line A-A' of FIG. 2, showing the steps of fabrication of a Josephson junction, shunt resistor, and contact via to the base electrode in accordance with one embodiment of the present invention.
Figure 3B:
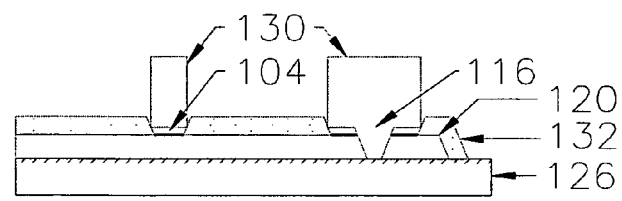
Figure 3C:
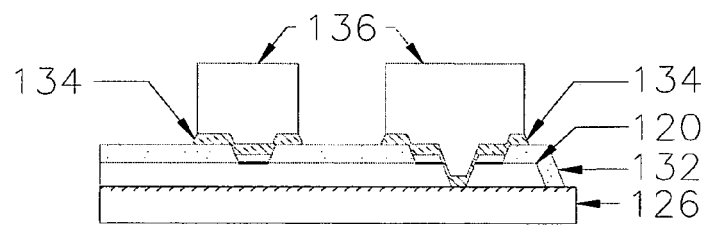
Figure 3D:
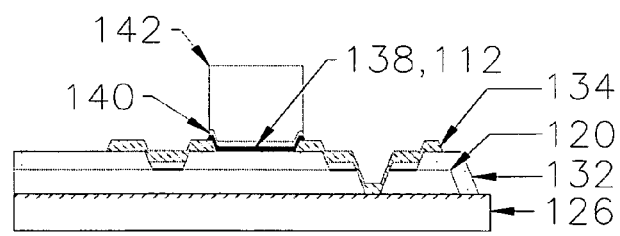
Figure 3E:
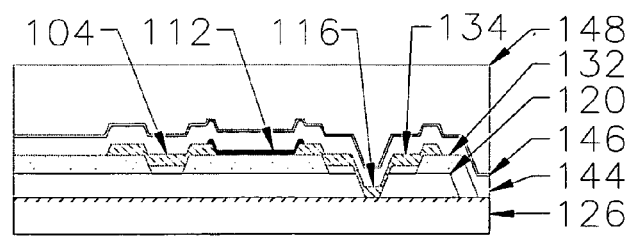
Figure 4A:
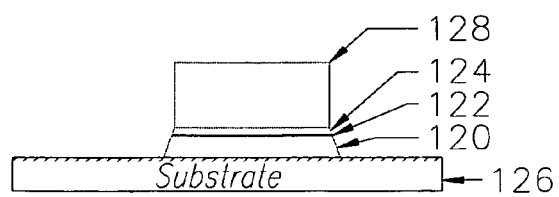
FIGS. 4A-F are cross-sectional views taken along line B-B' in FIG. 2, showing the steps of fabrication of a Josephson junction and the two outer turns of the input coil, constructed in accordance with one embodiment of the present invention.
Figure 4B:
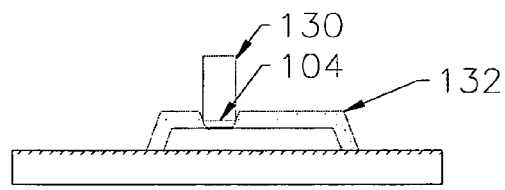
Figure 4C:
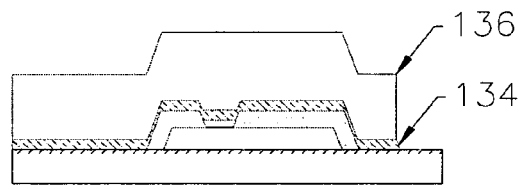
Figure 4D:
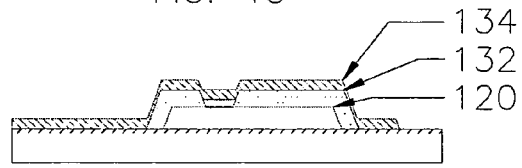
Figure 4E:
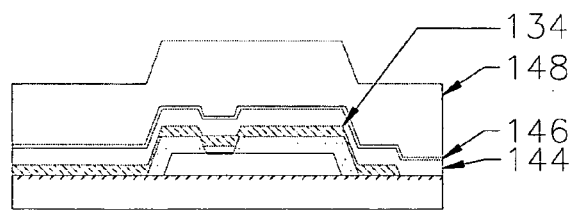
Figure 4F:
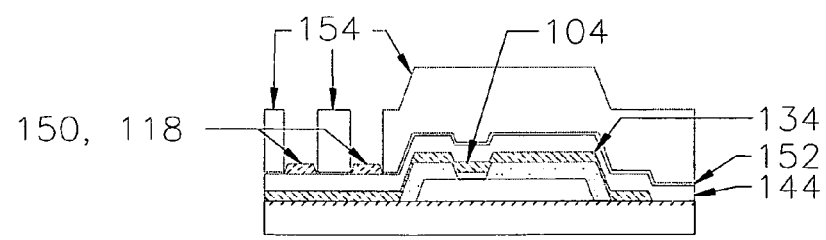
Figure 5A:
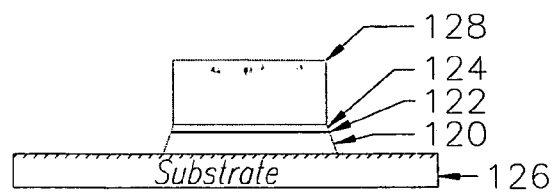
FIGS. 5A-F are cross-sectional views taken along line C-C' of FIG. 1 showing the steps of fabrication of the two innermost turns of the input coil and the contact via to a portion of the input coil that is electrically isolated from and passes underneath the SQUID washer, constructed in accordance with one embodiment of the present invention.
Figure 5B:
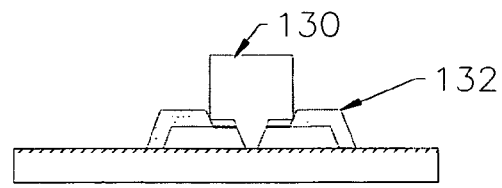
Figure 5C:
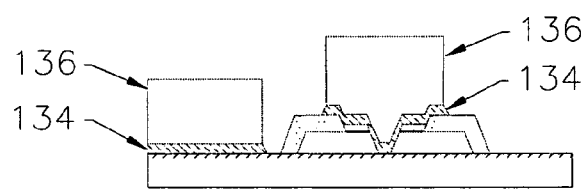
Figure 5D:
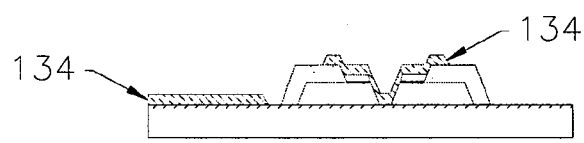
Figure 5E:
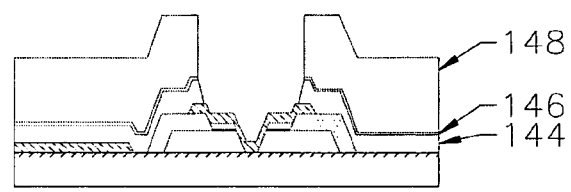
Figure 5F:
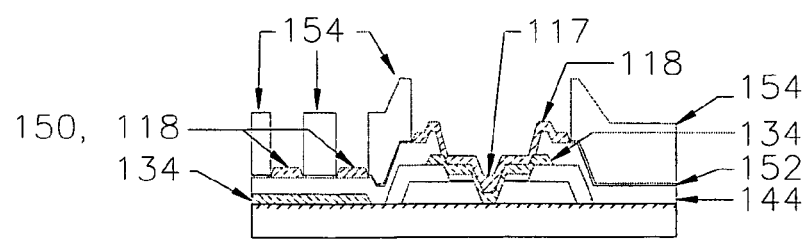

The partial plan view in FIG. 2 of the Josephson junction area of the SQUID layout in FIG. 1 references cross-sectional views A-A' and B-B' which are depicted in FIGS. 3A-E and 4A-E, respectively. These cross-sectional views, constructed in accordance with one embodiment of the present invention, illustrate the layer sequence described below that is used to fabricate the SQUID layout depicted in FIG. 1.

The fabrication process will be described in relation to FIGS. 3A through 5F, which detail how the individual deposition, patterning and etching steps are used to create the individual elements of the SQUID device. As such, FIGS. 3A-E detail the fabrication steps in relation to the formation of Josephson junction 104, shunt resistor 112 and contact via 116; FIGS. 4A-F illustrate the fabrication steps in relation to the formation of Josephson junction 104 and the two outer turns of the input coil 118; and FIGS. 5A-F illustrate the fabrication steps in relation to the formation of the two innermost turns of the input coil 118 and the contact via 117. Thus, referring to FIGS. 3A through 5F together, to start the process, a 250 nm niobium film 120, 70 nm aluminum film 122, and 30 nm niobium film 124 are deposited over an entire oxidized silicon wafer substrate 126. Although specific film layer thicknesses are disclosed, it is noted that such thicknesses are merely exemplary. Thus, niobium film 120 can be from about 150 nm to about 350 nm; aluminum film 122 can be from about 20 nm to about 120 nm; and niobium film 124 can be from about 20 nm to about 200 nm. These three films deposited in a single vacuum sequence are referred to as a trilayer. Before depositing the top, 30 nm niobium film 124 of the trilayer, oxygen is bled into the chamber to oxidize the exposed aluminum film 122. The oxidation pressure and time are chosen depending on the desired Josephson junction critical current density. Typically, the oxidation time is 30 minutes and the oxidation pressure is around 1 to 100 Torr, depending on the critical current density required. After the oxidation step is completed, the oxygen is pumped away and the top niobium film 124 is deposited to complete the trilayer. The trilayer is patterned using a photoresist stencil 128 and either a wet or reactive ion etch process. After etching, the photoresist stencil 128 is removed.

The etched trilayer film is patterned again using a photoresist stencil 130 to define the Josephson junctions 102, 104 and contact vias 114, 116. The exposed top niobium film 124 and aluminum film 122 are anodized to form an insulating oxide film 132. After anodization, the photoresist stencil 130 is removed.

The first niobium wiring layer 134, which can be from about 150 nm to about 500 nm thick, but preferably is about 250 nm thick, is deposited onto the anodized trilayer and patterned to define the SQUID washer 106 using a photoresist stencil 136 and a reactive ion etch process. After etching, the photoresist stencil 136 is removed.

A palladium or other resistive film 138 that is non-superconducting at the operating temperature of the device, which can be from about 10 nm to about 100 nm thick, but preferably is about 50 nm thick, is deposited onto the entire wafer, followed by the deposition of a silicon film or other sacrificial mask material 140, which can be from about 10 nm to about 500 nm thick, but preferably is about 110 nm thick, in the same vacuum sequence. The Josephson junction shunt resistors 110, 112 are patterned using a mask formed from the silicon film 140 on top of the palladium film 138. The silicon film 140 is patterned using a photoresist stencil 142 and reactive ion etch step, for which the palladium film serves as etch stop. Then, the photoresist stencil 142 is removed, and the palladium is etched using an argon ion mill process. After the palladium film 138 has been patterned, the silicon film mask 140 is removed using a reactive ion etch.

A doped polycrystalline or amorphous silicon semiconductor dielectric film 144, 390 nm thick, with a boron concentration below the MIT critical concentration Nc, is sputter-deposited using a boron-doped silicon target with a nominal room-temperature resistivity in the range from 0.020 to 0.005 $\Omega$-cm over the entire wafer. It is noted that although a thickness of about 390 nm is disclosed, film thicknesses of from about 100 to about 600 nm may be used. Likewise, although the use of silicon films and the use of boron doping are disclosed, other semiconductor materials, for example germanium and gallium arsenide, and other dopants, for example phosphorus and arsenic, are also appropriate.

In order to improve step coverage over the underlying first niobium wiring layer 134, the doped silicon film 144 is deposited using a series of deposition/etch steps. First, 60 nm of doped silicon is deposited and immediately followed by argon ion milling 20 nm of the freshly deposited silicon away. This deposition/etch cycle is repeated three times, then the wafer is removed and the exposed silicon is partially oxidized in an oxygen plasma. This process is repeated two times, then 150 nm of doped silicon is deposited over the entire wafer, resulting in a final doped silicon film 144 with a thickness of about 390 nm. It is noted that although specific deposition and etch thicknesses are disclosed, other deposition and etch thicknesses may be used, such that the ratio of the deposited film thickness to the etch thickness is around three to one. It is also noted that the above described application procedure would be appropriate when applying materials using a sputter deposition technique, in order to provide good step coverage and to avoid a "bread loafing" effect. If a PECVD process is used, the doped silicon layer can be deposited in a single step.

The contact via 117 is opened in the doped silicon film 144 as follows. First, a 40 nm aluminum film 146 is deposited over the entire wafer. Then, the contact via 117 is opened in the silicon film 144 using a photoresist stencil 148 and reactive ion etch process. When the photoresist stencil is exposed and developed, the developer also etches away the exposed areas of the aluminum film 146, exposing the silicon where the via 117 will be formed. Since the reactive ion etch process attacks oxidized silicon much more slowly, the doped silicon film 144 deposited with intermediate plasma oxidations will have a "stair-cased" edge profile after via etch. This improves step coverage by the subsequent layers. After etching the via 117, the photoresist stencil 148 and aluminum film 146 are removed.

The second niobium wiring layer 150, 500 nm thick, is deposited and patterned to define the input coil 118 using a bilayer photoresist 154 and 200 nm aluminum film 152 lift-off stencil. It should be noted that the second niobium wiring layer 150 can be provided in a thickness of from about 200 nm to about 700 nm, and that the aluminum film 152 thickness can be from about 150 nm to about 500 nm. After exposing and developing the photoresist 154, the exposed aluminum areas are overetched with an aluminum wet etchant in order to undercut the aluminum film 152 underneath the photoresist. Then, the top niobium film 150 is deposited and the combined aluminum/photoresist stencil 152, 154 is lifted off by soaking the wafer in aluminum etchant. Alternatively, a reactive ion etch process may be used to pattern the top niobium film 150. In this case, the aluminum film 146 is not removed after the via 117 is opened in the doped silicon film 144. The top niobium wiring layer 150 is deposited after the via 117 is opened, and patterned using a reactive ion etch process with the aluminum film 152 serving as a sacrificial etch stop layer that can easily be removed from the wafer following patterning.

It is noted that although the substrate material has been described as being oxidized silicon, any substrate commonly used for thin film devices (e.g. sapphire, gallium arsenide) can also be used. Likewise, although resistive film layer 138 has been described as being palladium, other non-superconducting materials can also be used. Further, wiring layers 134, 150 made from materials other than niobium can also be used (e.g., tantalum, aluminum, magnesium diboride, niobium nitride, high-temperature superconductors such as $YBa_2Cu_3O_7$, etc.)

Furthermore, as an alternative to using doped semiconductors for dielectric layer 144, amorphous metal-semiconductor mixtures having the desired metal-insulator-transition properties can also be used. Such amorphous metal-semiconductor mixtures undergo the desired metal-insulator phase transitions, depending on the concentration of the constituent metal. Examples of such mixtures are chromium-silicon mixtures and niobium-silicon mixtures.

In one embodiment of the invention, the doped silicon film 144 is replaced with a conventional dielectric film such as $SiO_2$, and the doped silicon film is deposited instead as a final conductive passivation layer, or as the first film of a multiple film passivation layer, on top of the entire wafer. The above process description remains unchanged, with the exception that, if the top niobium film 150 is patterned using a reactive ion etch process, the aluminum film 146 used to pattern the via 117 is not needed as a sacrificial etch stop and can be removed after etch of the via 117. When used as the final passivation layer only, the doped silicon film can contact all of the device contact pads, and thus the desired charge distribution between metal layers is still achieved (at room temperature). This embodiment can simplify device construction compared to the previous embodiments because it allows the manufacturer to use standard materials and processes to build all but the final layer of the device.

The invention has been described in relation to the construction of Josephson tunnel junctions in a SQUID device, to protect the sensitive Josephson junctions with tunnel barriers on the order of several Angstroms thickness as well as wiring layers from the detrimental effects of ESD. It will be appreciated, however, that in addition to this specific implementation, other applications are envisioned. In one non-limiting example, the invention could be implemented to build superconducting tunnel junction (STJ) detectors, such as those commonly used in photon (e.g., visible or x-ray) detection devices. In short, the invention has application to any of a wide variety of cryogenic devices that are susceptible to static damage at room temperatures, as will be appreciated by one of ordinary skill in the art.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A thin film device comprising:
   a substrate;
   a first conductive material layer overlying the substrate; and
   a layer of metal-insulator transition material overlying the conductive material layer;
   wherein the layer of metal insulator transition material comprises a final passivation layer on top of said device;
   wherein the transition material layer acts as a conductor when the device is at a first temperature to thereby protect the first conductive material layer from damage due to electrostatic discharge during handling,
   wherein the transition material layer acts as an insulator when the device is at its operating temperature; and
   wherein the first temperature is about 300 K and the operating temperature is about 4 K.

2. The thin film device of claim 1, wherein the metal-insulator transition material comprises a doped silicon semiconductor material.

3. The thin film device of claim 2, wherein the doped silicon semiconductor material comprises a doped crystalline silicon material having an MIT critical concentration N, of about $3.5 \times 10^{13}/cm^3$ or less.

4. The thin film device of claim 2, wherein the doped silicon semiconductor material has a doping level sufficient to allow the silicon semiconductor material to act as a conductor at the first temperature, and to act as an insulator when cooled to a temperature of less than about 100 K.

5. The thin film device of claim 1, wherein the metal-insulator transition material comprises an amorphous metal semiconductor mixture.

6. The thin film device of claim 1, wherein the conductive material layer comprises niobium.

7. The thin film device of claim 1, further comprising a second conductive material layer overlying said first conductive material layer, said first and second conductive material layers separated by a layer of dielectric material.

8. The thin film device of claim 1, wherein the conductive material layer has a thickness of about 10 nm to about 1000 nm.

9. The thin film device of claim 1, wherein the layer of metal-insulator transition material has a thickness of about 25 nm to about 1000 nm.

10. The thin film device of claim 1, further comprising a plurality of alternating layers of conductive material and dielectric material disposed between the first conductive material layer and the layer of metal insulator transition material.

11. The thin film device of claim 1, wherein the device further comprises a plurality of contact pads, and the metal insulator transition layer contacts all of said contact pads.

12. A thin film device comprising:
a substrate;
a first conductive material layer overlying the substrate; and
a layer of metal-insulator transition material overlying the conductive material layer;
wherein the layer of metal insulator transition material comprises a final passivation layer on top of said device;
wherein the transition material layer acts as a conductor when the device is at a first temperature to thereby protect the first conductive material layers from damage due to electrostatic discharge during handling,
wherein the transition material layer acts as an insulator when the device is at its operating temperature, and
wherein the thin film device comprises a Josephson junction.

13. The thin film device of claim 12, wherein the metal-insulator transition material comprises a doped silicon semiconductor material having a doping level sufficient to allow the silicon semiconductor material to act as an insulator when cooled to a temperature of less than about 100 K.

14. A thin film device comprising:
a substrate;
a first conductive material layer overlying the substrate; and
a layer of metal-insulator transition material overlying the conductive material layer;
wherein the layer of metal insulator transition material comprises a final passivation layer on top of said device;
wherein the transition material layer acts as a conductor when the device is at a first temperature to thereby protect the first conductive material layers from damage due to electrostatic discharge during handling;
wherein the transition material layer acts as an insulator when the device is at its operating temperature;
wherein the operating temperature is less than about 100 K
wherein the thin film device further comprises a second conductive material layer overlying said first conductive material layer, said first and second conductive material layers separated by a layer of dielectric material; and
wherein a third conductive material layer overlies said second conductive material layer, said second and third conductive material layers separated by a layer of dielectric material, and wherein the layer of metal insulator transition material overlies the third conductive material layer.

15. The thin film of claim 14, wherein the layer of metal insulator transition material acts as a conductor when the device is at a first temperature to thereby protect at least one of the first, second and third conductive material layers from damage due to electrostatic discharge during handling, and wherein the transition material layer acts as an insulator when the device is at its operating temperature.

16. A thin film device comprising:
a substrate;
first and second conductive material layers overlying the substrate; and
a passivation layer overlying the first and second conductive material layers, said passivation layer comprising a layer of metal-insulator transition material;
wherein the passivation layer comprises a final layer on a top surface of said device; and
wherein the transition material layer acts as a conductor when the device is at room temperature to thereby protect the first conductive material layer from damage due to electrostatic discharge during handling, and the transition material layer acts as an insulator when the device is at its operating temperature.

17. The thin film device of claim 16, wherein the passivation layer further comprises a dielectric layer overlying said layer of metal-insulator transition material.

18. The thin film device of claim 16, wherein the device further comprises a plurality of contact pads connected with said first and second conductive material layers, and said layer of metal-insulator transition material contacts said contact pads.

* * * * *